(12) United States Patent
Shen et al.

(10) Patent No.: US 7,329,473 B2
(45) Date of Patent: Feb. 12, 2008

(54) SECONDARY BATTERY

(75) Inventors: Ko-Chen Shen, Taipei (TW); Hsi-Ming Shu, Taipei (TW); Cheng Hsin Chen, Taipei (TW)

(73) Assignee: Antig Technology Co., Ltd., Taipei (TW)

( * ) Notice: Subject to any disclaimer, the term of this patent is extended or adjusted under 35 U.S.C. 154(b) by 455 days.

(21) Appl. No.: 11/114,890

(22) Filed: Apr. 27, 2005

(65) Prior Publication Data

US 2005/0255381 A1 Nov. 17, 2005

(51) Int. Cl.
*H01M 2/02* (2006.01)

(52) U.S. Cl. .............................. 429/177; 429/7; 429/82; 429/185

(58) Field of Classification Search .............. 429/185, 429/176, 177, 82, 175, 9
See application file for complete search history.

(56) References Cited

U.S. PATENT DOCUMENTS 5,019,468 A * 5/1991 Miyabayashi ............... 429/241

FOREIGN PATENT DOCUMENTS

WO    WO 99/30376    *   6/1999

* cited by examiner

*Primary Examiner*—Patrick Joseph Ryan
*Assistant Examiner*—Thomas H. Parsons

(57) ABSTRACT

The present invention is a secondary battery, comprising an upper housing, an upper accommodated tank, a main component of battery, a lower accommodated tank, a lower housing each is laminated orderly by layers to form a sealed structure of the secondary battery. The upper accommodated tank is made of a printed circuit board (PCB) material and is used to accommodate electrolyzed material. The lower accommodated tank is made of printed circuit board material and used to accommodate the electrolyzed material. The main component of the secondary battery is inserted between the upper accommodated tank and the lower accommodated tank. The upper tank made of a printed circuit board material is used to cover the upper accommodated tank closely, while the lower tank made of a printed circuit board material is used to cover the lower accommodated tank closely.

26 Claims, 13 Drawing Sheets

SECONDARY BATTERY

FIELD OF THE INVENTION

The present invention relates to a secondary battery. Particularly the present invention relates to a secondary battery manufactured by a printed circuit board process.

BACKGROUND OF THE INVENTION

Conventional structures of secondary battery such as lithium rechargeable battery, Ni—H rechargeable battery, lithium polymer rechargeable battery all adopt sealed housings with metal packaging so as to seal the material that forms said rechargeable batteries, such as cathode, anode, separator, electrolyte, etc., inside the metal housing closely.

It's obvious that the conventional structure of a secondary battery can't adopt a PCB process to manufacture the secondary battery. Therefore the inventors invent a kind of secondary battery that can be manufactured by a PCB process.

SUMMARY OF THE INVENTION

The present invention provides a kind of secondary battery that can be manufactured by a PCB process.

To achieve the above goals of the present invention, the present invention provides a secondary battery comprising, an upper accommodated tank made of a PCB material for accommodating an electrolyzed material, a lower accommodated tank made of a PCB material for accommodating the electrolyzed material, a main component of the secondary battery inserted between the upper accommodated tank and the lower accommodated tank, an upper housing made of a PCB material for covering the upper accommodated tank closely, a lower housing made of a PCB material for covering the lower accommodated tank closely; wherein said upper housing, said upper accommodated tank, said main component of the secondary battery, said lower accommodated tank and said lower housing are laminated orderly layer by layer to form a sealed structure of the secondary battery.

To allow those skilled in the art to understand the purpose, characteristics and effects of the present invention, the present invention is described in details by the following embodiments and accompanied figures.

BRIEF DESCRIPTION OF THE INVENTION

The above objects and advantages of the present invention will become more apparent with reference to the appended drawings wherein.

DETAILED DESCRIPTION OF THE INVENTION

Figure 1:
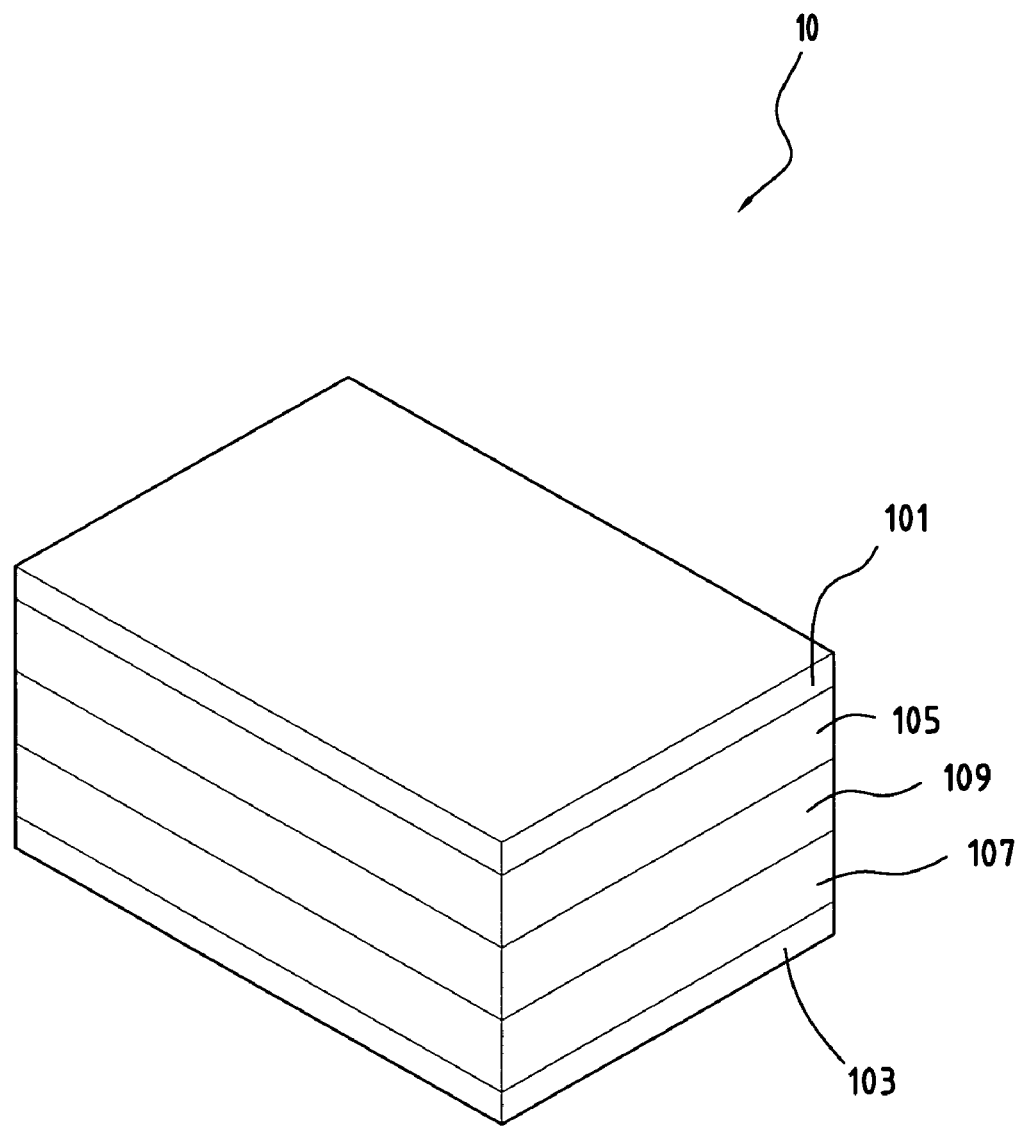
FIG. 1 is a block diagram showing the secondary battery of the present invention.
Figure 2:
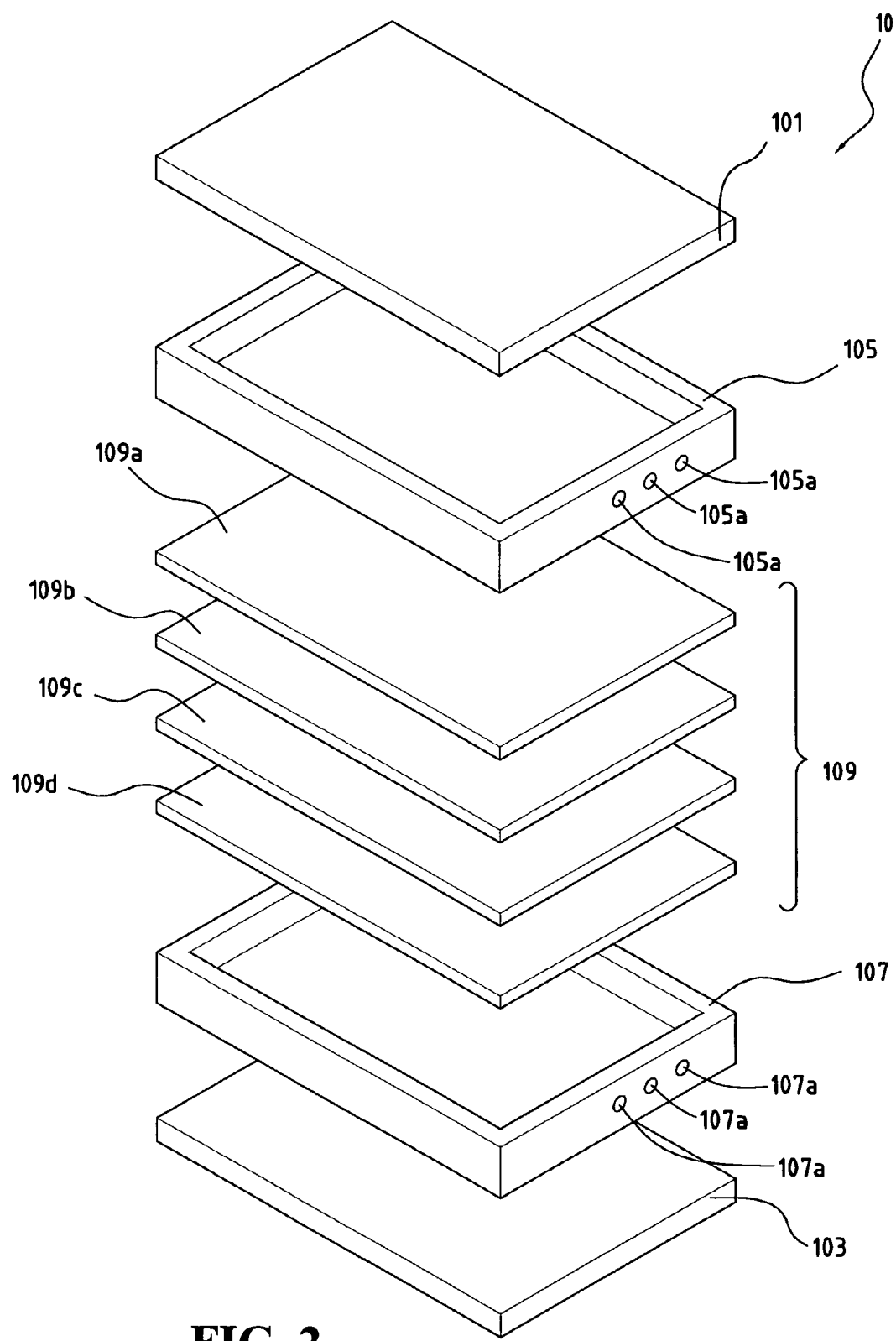
FIG. 2 is an exploded diagram showing the secondary battery of the present invention.
Figure 3:
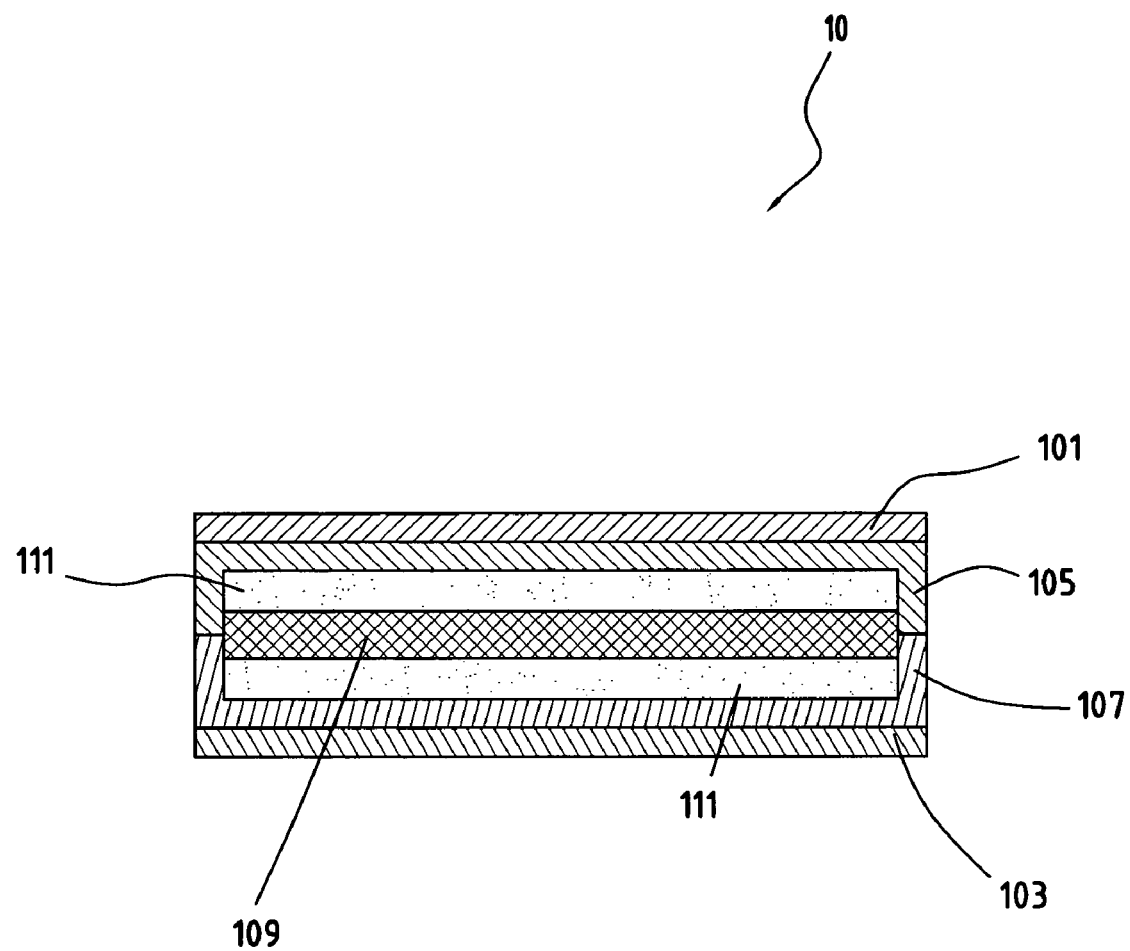
FIG. 3 is a cross-sectional diagram showing the secondary battery of the present invention.

What the secondary battery 10 of the present invention emphasizes is to adopt a PCB material to form an upper housing 101, an upper accommodated tank 105, a lower accommodated tank 107 and a lower housing 103. The PCB material adopted can be, for example, FR4, flexible printed circuit board and so on. FIG. 1 is a block diagram showing the secondary battery of the present invention, FIG. 2 is an exploded diagram showing the secondary battery of the present invention, and FIG. 3 is a cross-sectional diagram showing the secondary battery of the present invention. The secondary battery 10 of the present invention mainly comprises an upper housing 101, an upper accommodated tank 105, a main component of the secondary battery 109, a lower accommodated tank 107, and a lower housing 103 that are laminated orderly by layers from top to bottom so as to form a closely connected structure of the secondary battery.

The components of the present invention are made of a PCB material except the main component of the secondary battery 109, and the PCB material adopted can be, for example, FR4. In assembling the secondary battery 10 of the present invention, the upper accommodated tank 105 and the lower accommodated tank 107 are used to accommodate an electrolyzed material 111; the main component of the secondary battery 109 is inserted between the upper accommodated tank 105 and the lower accommodated tank 107. The main component of the secondary battery 109, the upper accommodated tank 105 and the lower accommodated tank 107 can be laminated by pressing, adhering and so on, and then the upper housing 101 can cover and seal the upper accommodated tank 105, while the lower housing 103 can cover and seal the lower accommodated tank 107 as well as stack them by pressing, adhering and so on. The choices of the above mentioned electrolyzed material 111 depend on the main component of the secondary battery 109 used. For example, an electrolyte made of organic solvents or non-aqueous solvents can be used, or an electrolyzed-like material that can be sprayed or coated can be use so as to replace the electrolyte. The above-mentioned upper accommodated tank 105 and the lower accommodated tank 107 further provide at least one ventilated hole 105a, 107a on their walls respectively in order to exhaust the reacted gas.

The specific method to stack the main component of the secondary battery 109, the upper accommodated tank 105 and the lower accommodated tank 107, the specific method to cover and seal the upper accommodated tank 105 by the upper housing 101, and the specific method to cover and seal the lower accommodated tank 107 by the lower housing 103 can be carried out by using epoxy resin as the adhering medium, and then to stack the main component of the secondary battery 109, the upper accommodated tank 105 and the lower accommodated tank 107, to cover and seal the upper accommodated tank 105 by the upper housing 101, and to cover and seal the lower accommodated tank 107 by the lower housing 103 by printing, coating or film laminating, and then to press them in the hot-press machine under temperature of 40° C.~120° C. and pressure of 2~50 kg/cm2.

The main component of the secondary battery 109 in accordance with the present invention mainly comprises an anode 109a, a cathode 109c and separators 109b and 109d, wherein the separators 109b and 109d are mainly used to separate the anode 109a and the cathode 109c. The main component of the secondary battery 109 of the present invention can use the same materials adopted by the present lithium rechargeable battery, Ni—H rechargeable battery and lithium polymer rechargeable battery. Certainly, the present invention is not limited to the materials used to manufacture lithium rechargeable battery, Ni—H rechargeable battery and lithium polymer rechargeable battery. Those skilled in the art can use any other materials for the main component of the secondary battery 109, and these changes are still protected within the scope of the present invention.

Figure 4:
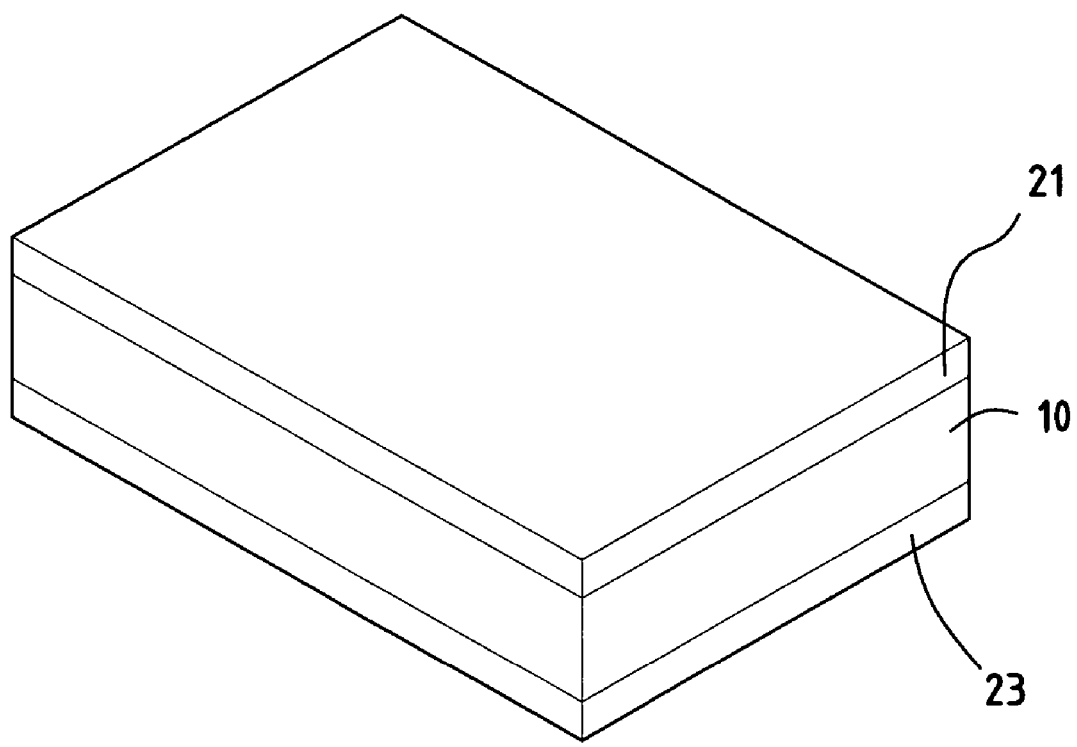
FIG. 4 is a block diagram showing the secondary battery providing an upper and a lower leak-proof layers therein in accordance with the present invention.
Figure 5A:
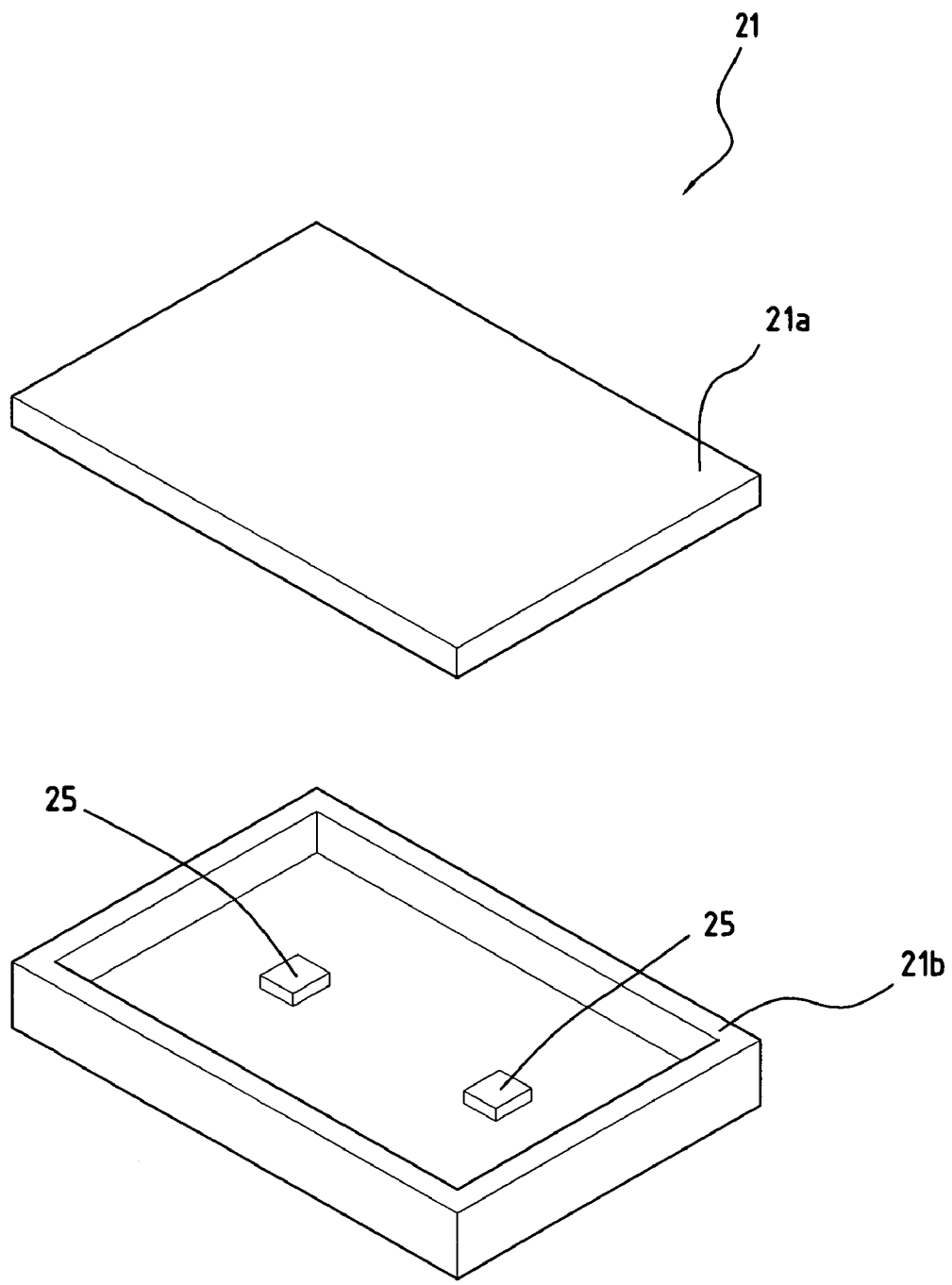
FIG. 5A is an exploded diagram showing the upper leak-proof layer of the present invention.
Figure 5B:
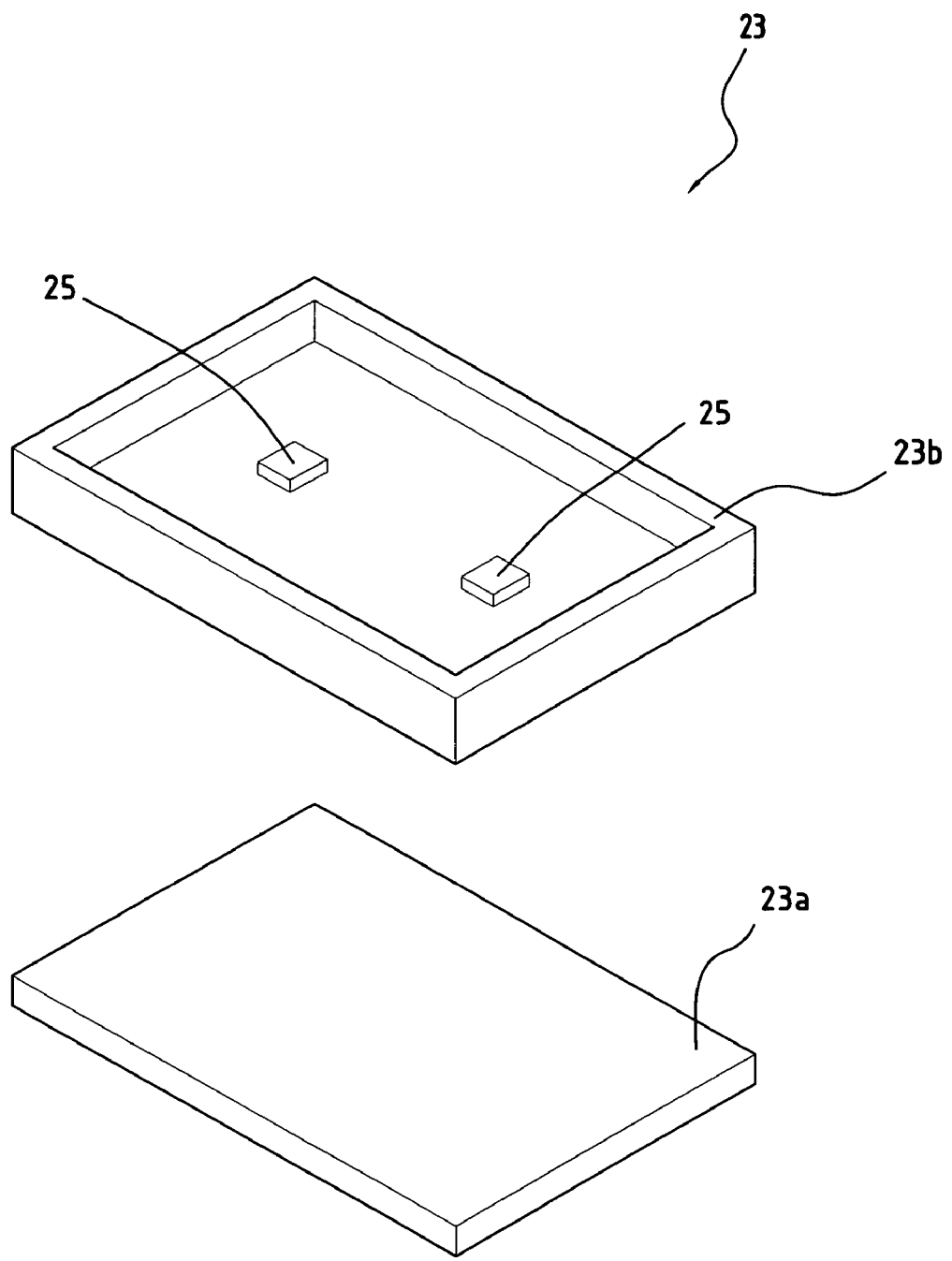
FIG. 5B is an exploded diagram showing the lower leak-proof layer of the present invention.

FIG. 4 is a block diagram showing the secondary battery providing an upper and a lower leak-proof layers therein in accordance with the present invention, FIG. 5A is an exploded diagram showing the upper leak-proof layer of the present invention, and FIG. 5B is an exploded diagram showing the lower leak-proof layer of the present invention. To further prevent the electrolyzed materials 111 from leaking out from the upper accommodated tank 105 or the lower accommodated tank 107, the present invention provides an upper leak-proof layer 21 and a lower leak-proof layer 23 on the upper outer side and the lower outer side of the secondary battery 10 respectively, and the two layers 21, 23 are similarly laminating by layers and closely connect to the upper and lower sides of the secondary battery 10 respectively. In FIG. 5A, the upper leak-proof layer 21 comprises an upper slot 21b and an upper cover 21a; the upper cover 21a is used to cover and seal the upper slot 21b. In FIG. 5B, the lower leak-proof layer 23 comprises a lower slot 23b and a lower cover 23a; the lower cover 23a is used to cover and seal the upper slot 23b. The upper slot 21b, the lower slot 23b, the upper cover 21a and the lower cover 23a of this embodiment are also made of a PCB material. If the electrolyzed material 111 leak out, the upper slot 21b can hold and accommodate the electrolyzed material 111 leaked out from the upper accommodated tank 105, and the lower slot 23b can hold and accommodate the electrolyzed material 111 leaked out from the lower accommodated tank 107.

Figure 6A:
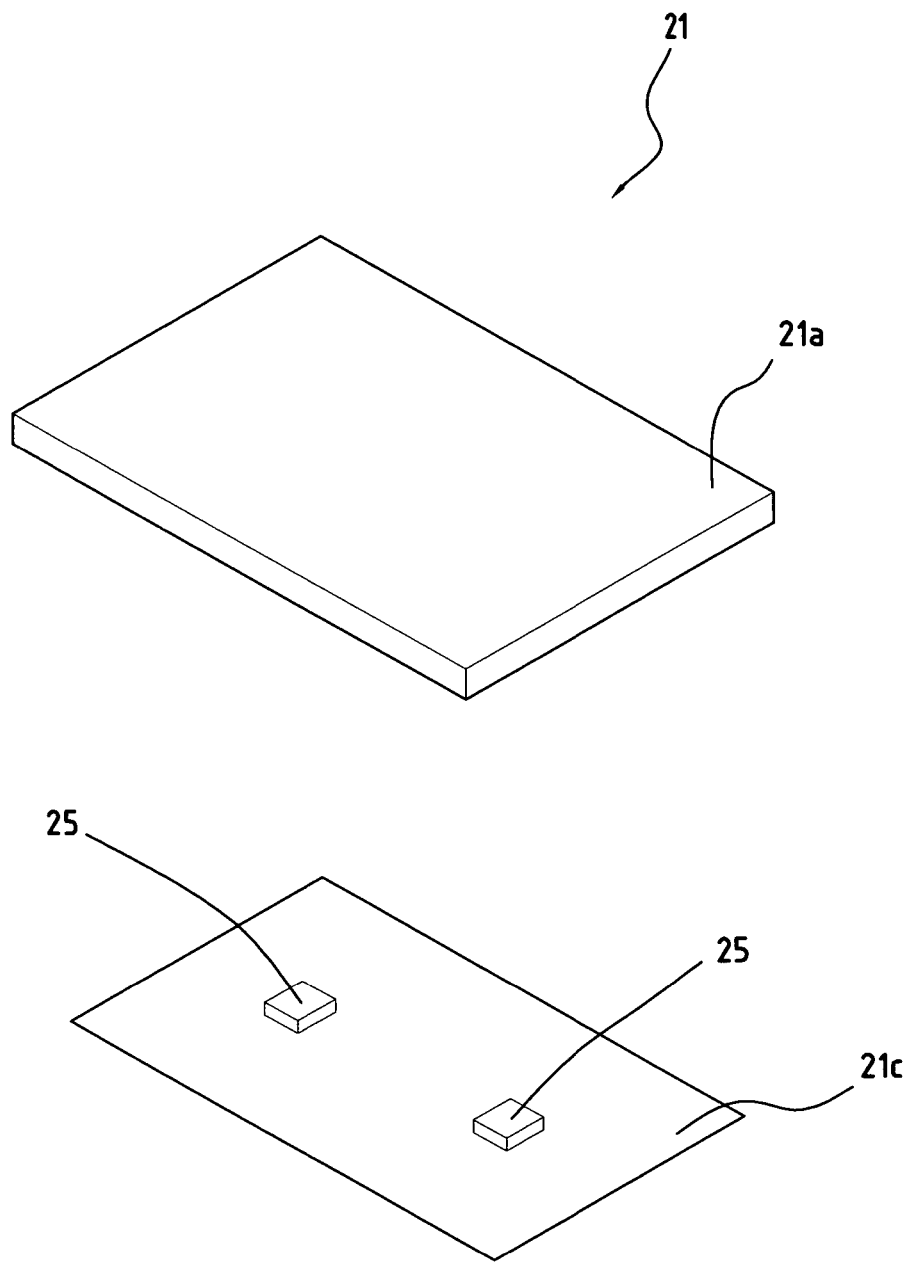
FIG. 6A is an exploded diagram showing the upper leak-proof layer of another embodiment of the present invention.
Figure 6B:
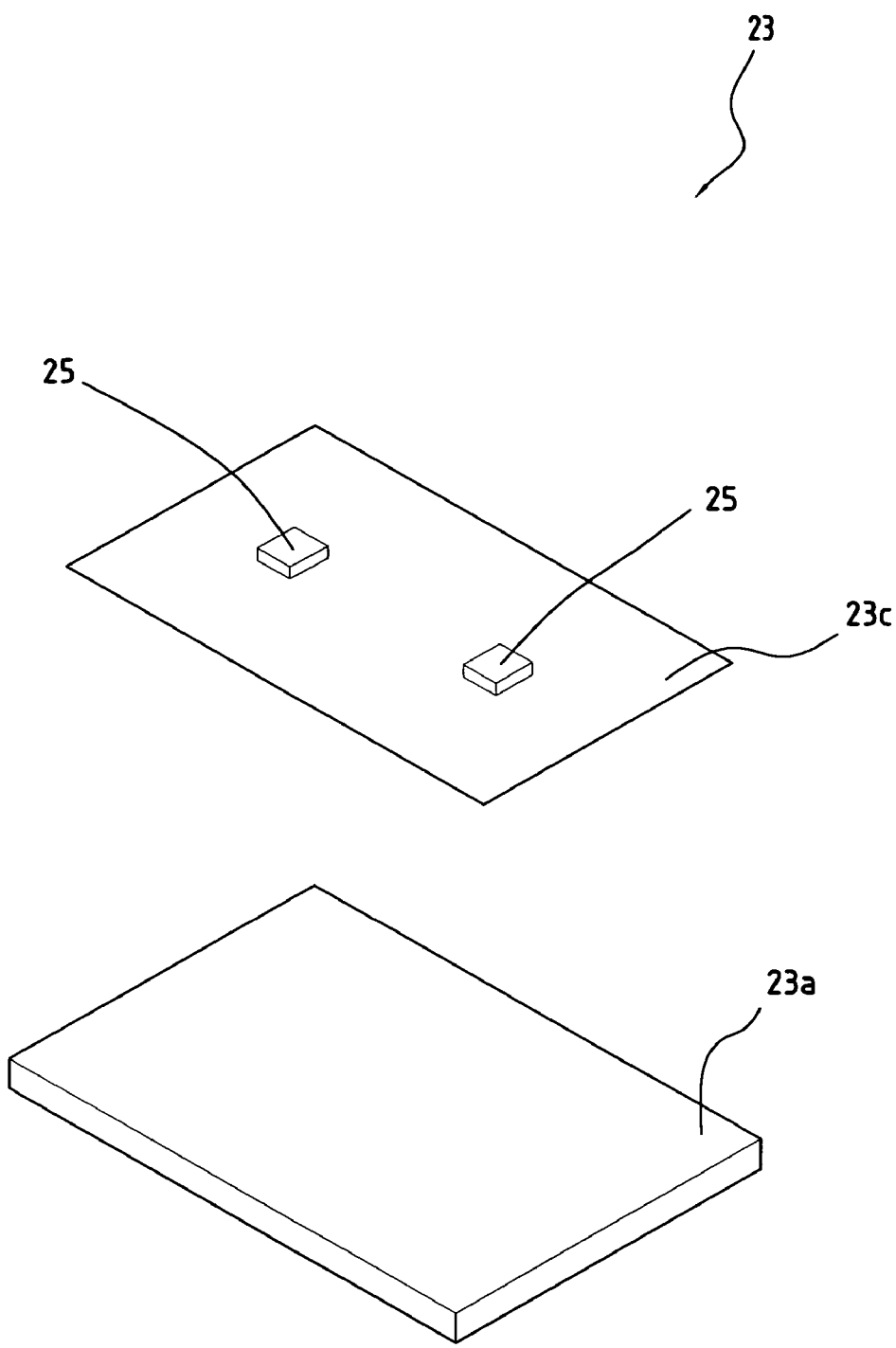
FIG. 6B is an exploded diagram showing the lower leak-proof layer of another embodiment of the present invention.

FIG. 6A is an exploded diagram showing the upper leak-proof layer of another embodiment of the present invention, and FIG. 6B is an exploded diagram showing the lower leak-proof layer of another embodiment of the present invention. In FIG. 6A, the upper leak-proof layer 21 comprises an upper absorber 21c and an upper cover 21a; the upper cover 21a is used to cover and seal the upper absorber 21c. In FIG. 6B, the lower leak-proof layer 23 comprises a lower absorber 23c and a lower cover 23a; the lower cover 23a is used to cover and seal the lower absorber 23c. The upper cover 21a and the lower cover 23a of this embodiment are also made of a PCB material, and the upper absorber 21c and the lower absorber 23c are made of an absorbable material. If the electrolyzed material 111 leaks out, the upper absorber 21c can be used to absorb and hold the electrolyzed material 111 leaked out from the upper accommodated tank 105, while the lower absorber 23c can used to absorb and hold the electrolyzed material 111 leaked out from the lower accommodated tank 107.

The specific structure adopted by the upper accommodated tank 105, the lower accommodated tank 107, the upper slot 21b and the lower slot 23b of the present invention mentioned above can be a hollow frame structure such as a hollow rectangular frame in order to accommodate an electrolyzed material 111 by a closed and enveloped internal space therein.

After the secondary battery 10 with the upper and lower leak-proof layers 21 and 23 provided inside is laminated by layers and connected together, it's not easy to find the leakage with the naked eye if the electrolyzed material 111 leaks out from the upper and/or lower leak-proof layers 21, 23. To further detect whether the leakage of electrolyzed material 111 has happened according to the present invention, sensors 25 are provided to the upper slot 21b, the lower slot 23b, the upper absorber 21c and the lower absorber 23c, respectively. The electric signals are produced as the sensors 25 detect the electrolyzed materials 111 so as to notify on the leakage of electrolyzed materials 111.

Figure 7:
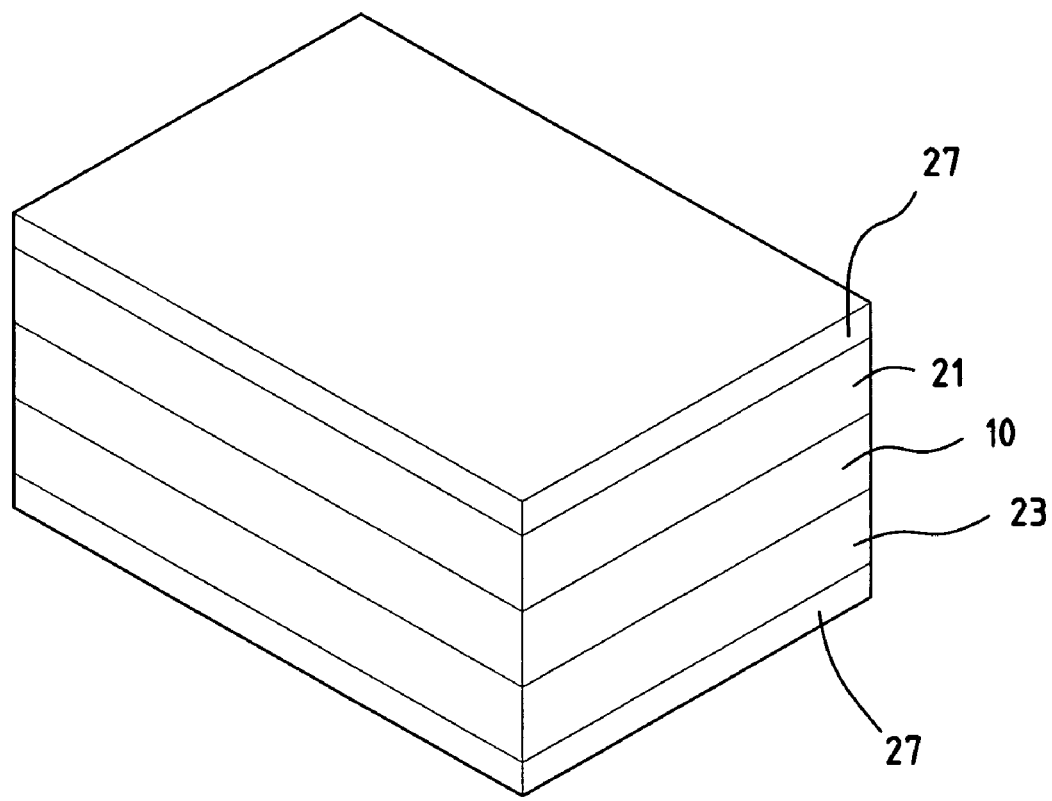
FIG. 7 is a block diagram showing the secondary battery providing a metal sheet therein in accordance with the present invention.
Figure 8:
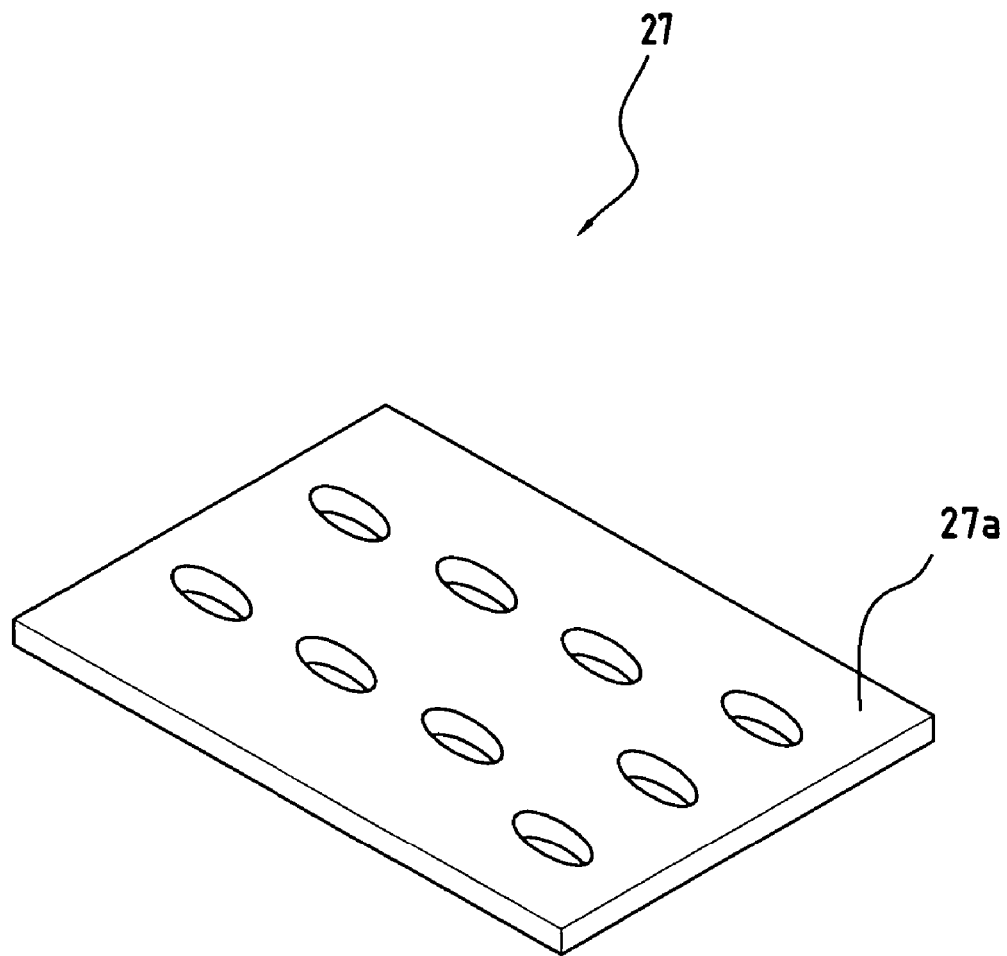
FIG. 8 is a structure diagram showing the secondary battery with the metal sheet in accordance with the present invention.

FIG. 7 is a block diagram showing the secondary battery providing a metal sheet therein in accordance with the present invention, and FIG. 8 is a structure diagram showing the metal sheet of the present invention. To improve the safety of use and heat dissipation of the secondary battery 10 of the present invention, a metal sheet 27 is connected closely and laminated to the outer side of the upper and lower covers 21a, 23a according to the present invention. Numerous holes 27a are provided to the metal sheet 27 to facilitate the dissipation of heat produced inside the secondary battery 10, while the safety of use of the secondary battery 10 of the present invention can be improved by the firmness of its physical nature.

Figure 9:
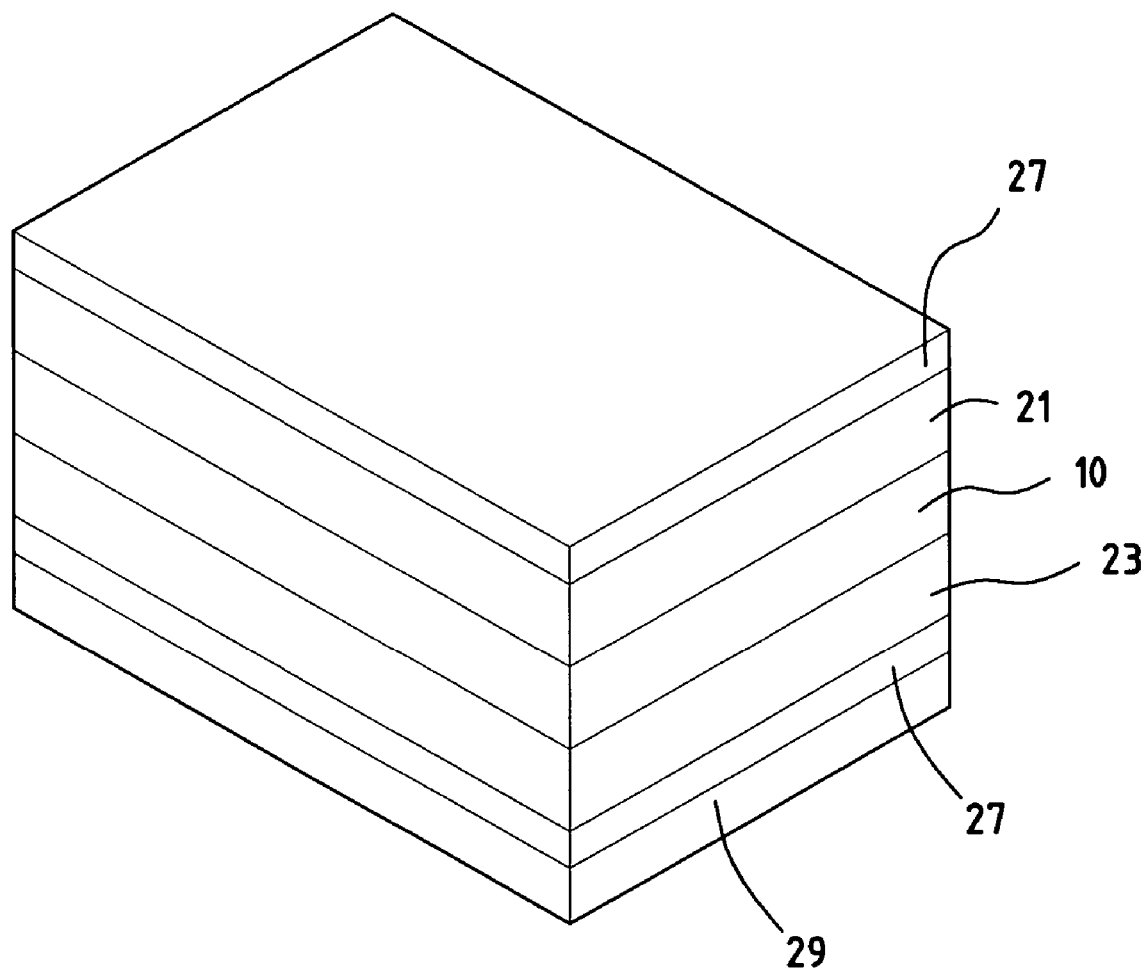
FIG. 9 is a block diagram showing the secondary battery providing a circuit-control layer therein in accordance with the present invention.
Figure 10:
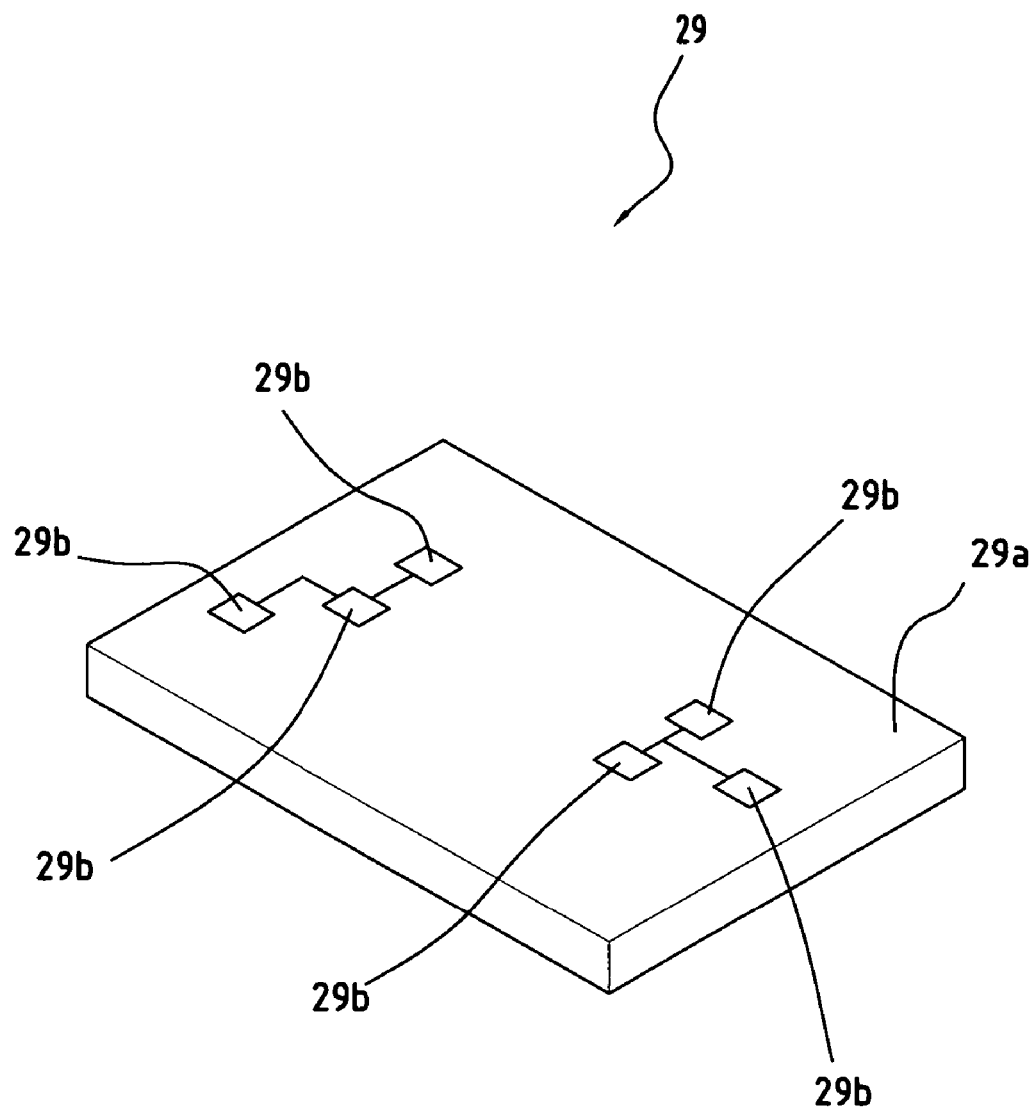
FIG. 10 is a structure diagram showing the circuit-control layer of the present invention.

FIG. 9 is a block diagram showing the secondary battery providing a circuit-control layer therein in accordance with the present invention, and FIG. 10 is a structure diagram showing the circuit-control layer of the present invention. To enable the secondary battery 10 of the present invention to not only provide electric power, but also provide intelligent management on electric power control, the secondary battery 10 of the present invention further comprises a circuit-control layer 29 which can be connected closely and laminated to the outer side of the metal sheet 27. The circuit-control layer 29 includes a printed circuit board substrate 29a and at least one electric components 29b. These electric components 29b are directly soldered on the printed circuit substrate 29a. The circuit formed by these circuit components 29b can be rechargeable circuits, electric power management circuits and so on, and the printed circuit substrate 29a can be made of a CCL (copper clad laminate)-based PCB material.

Figure 11:
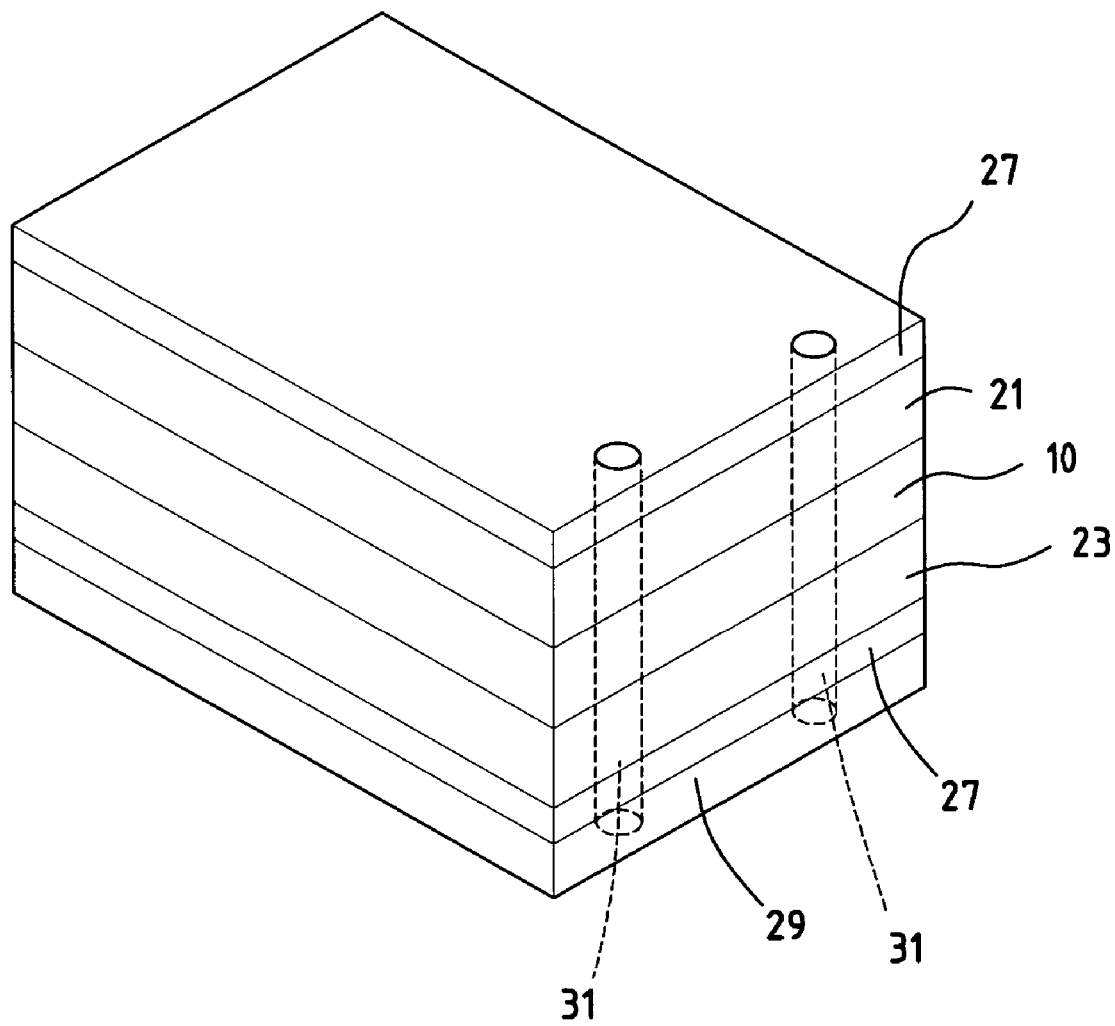
FIG. 11 is a block diagram showing the secondary battery providing via holes therein in accordance with the present invention.

FIG. 11 is a block diagram showing the secondary battery providing via holes therein in accordance with the present invention. In FIG. 11, each layer 10, 21, 23, 27, 29 of the present invention are provided with via holes 31 respectively, and these via holes 31 of each layer are able to connect to each other. For example, via holes can be connected in a straight line. After each layer 10, 21, 23, 27, 29 as shown in FIG. 11 is pressed, exert electroplated conductive material, pour into silver adhesive or rivet conductive metal rivets or other conductive materials as fill-ins so as to electrically connect the layer 10, 21, 23, 27, 29 to each other. The via holes 31 provided to the outer most layer, such as via holes 31 of the circuit-control layer 29, are connected further to a pad (not shown) and then connected to outside through the pad in order to enable the main component of the secondary battery 109 within the layers to be electrically connected to outside as well as to give consideration to safety so as to prevent users from contacting the main component of the secondary battery directly.

The secondary battery 10 of the present invention provides a structure of the secondary battery different from that of prior art. Meanwhile, because all components except the main components of the secondary battery 109 according to present invention are all made of a PCB material, the methods to laminate each component by layers to form a secondary battery 10 with a closely connected structure can also directly use a PCB-related processes.

Advantages of the manufacturing methods and the main component of the secondary battery 109 of the present invention are as follows:

1. Integrated manufacturing cost and low material cost that fit the economic efficiency;
2. Suitable for use in mass production process and standardization;
3. Low requirements to the peripheral system;
4. Low circuit resistance;
5. Light, slim and small; and
6. Meet the standard needs of a variety of different supply voltages and currents.

Though the present invention has been described above by specific embodiments, the disclosure is not intended to limit the present invention. Anyone skilled in the art can make any changes and modifications without leaving the spirit and scope of the present invention. Any changes and modifications are protected within the scope of the present invention. The protected scope of the present invention is set forth in the claims attached afterwards.

What is claimed is:

1. A secondary battery, comprising,
    an upper accommodated tank made of a PCB material used to accommodate an electrolyzed material,
    an lower accommodated tank made of a PCB material used to accommodate said electrolyzed material,
    a main component of said secondary battery inserted between said upper accommodated tank and said lower accommodated tank,
    an upper housing made of a PCB material used to cover and seal said upper accommodated tank,
    a lower housing made of a PCB material used to cover and seal said lower accommodated tank,
wherein said upper housing, said upper accommodated tank, said main component of said secondary battery, said lower accommodated tank and said lower housing are laminated by layers orderly to form a closely connected secondary battery.

2. The secondary battery according to claim 1, wherein said electrolyzed material is an electrolyzed material composed of organic solvents or nonaqueous solvents.

3. The secondary battery according to claim 1, wherein said electrolyzed material is an electrolyzed liquid composed of organic solvents or nonaqueous solvents.

4. The secondary battery according to claim 1, wherein said electrolyzed material is an electrolyzed-like material that can be sprayed or coated.

5. The secondary battery according to claim 1, wherein said structure of said upper accommodated tank is a rectangular hollow frame.

6. The secondary battery according to claim 1, wherein said upper accommodated tank further comprises a ventilated hole.

7. The secondary battery according to claim 1, wherein said structure of lower accommodated tank is a rectangular hollow frame.

8. The secondary battery according to claim 1, wherein said lower accommodated tank further comprises a ventilated hole.

9. The secondary battery according to claim 1, wherein said main component of said secondary battery is selected from a main component of battery manufactured for lithium rechargeable battery, Ni—H rechargeable battery or lithium polymer rechargeable battery.

10. The secondary battery according to claim 1, wherein said main component of said secondary battery comprises an anode, a separating membrane and a cathode.

11. The secondary battery according to claim 1, further comprises an upper leak-proof layer which is used to cover and seal said upper housing and to prevent the electrolyzed material accommodated in said upper accommodated tank from leaking out.

12. The secondary battery according to claim 11, wherein said upper leak-proof layer comprises,
    an upper slot made of a PCB material used to accommodate said electrolyzed material leaked out from said upper accommodated tank,
    an upper cover made of a PCB material used to cover and seal said upper slot.

13. The secondary battery according to claim 11, wherein said upper leak-proof layer comprises,
    an upper absorber made of an absorbable material used to absorb said electrolyzed material leaked out from said upper accommodated tank,
    an upper cover made of a PCB material used to cover and seal said upper absorber.

14. The secondary battery according to claim 11, further comprising,
    a sensor provided in said upper leak-proof layer and used to detect whether the upper leak-proof has accommodated any electrolyzed material leaked out.

15. The secondary battery according to claim 11, further comprising,
    a metal sheet covering and sealing said upper leak-proof layer.

16. The secondary battery according to claim 11, further comprising,
    a via hole provided to said upper leak-proof layer.

17. The secondary battery according to claim 1, further comprises a lower leak-proof layer which is used to cover and seal said lower housing and to prevent the electrolyzed material accommodated in said lower accommodated tank from leaking out.

18. The secondary battery according to claim 17, wherein said lower leak-proof layer comprises,
    a lower slot made of a PCB material used to accommodate said electrolyzed material leaked out from said lower accommodated tank,
    a lower cover made of a PCB material used to cover and seal said lower slot.

19. The secondary battery according to claim 17, wherein said lower leak-proof layer comprises,
    a lower absorber made of an absorbable material used to absorb said electrolyzed material leaked out from said lower accommodated tank,
    a lower cover made of a PCB material used to cover and seal said lower absorber.

20. The secondary battery according to claim 17, further comprising,
   a sensor provided in said lower leak-proof layer and used to detect whether the lower leak-proof has accommodated any electrolyzed material leaked out.

21. The secondary battery according to claim 17, further comprising,
   a metal sheet covering and sealing said lower leak-proof layer.

22. The secondary battery according to claim 17, further comprising,
   a via hole provided to said lower leak-proof layer.

23. The secondary battery according to claim 1, further comprising,
   a circuit-control layer comprising a printed circuit substrate and at least one electric component provided on said printed circuit substrate, wherein said circuit-control layer are stacked by layers with said secondary batter to perform a closely connected structure.

24. The secondary battery according to claim 23, further comprising,
   a via hole provided to said circuit-control layer.

25. The secondary battery according to claim 23, wherein said PCB material is selected from FR4 or flexible printed circuit board.

26. The secondary battery according to claim 1, further comprising,
   a via hole provided to said upper accommodated housing, said upper accommodated tank, said main component of the secondary battery, said upper housing and said lower housing respectively.

* * * * *